United States Patent
Miyamoto et al.

(10) Patent No.: US 6,531,933 B2
(45) Date of Patent: Mar. 11, 2003

(54) FILTER UNIT HAVING TWO ATTENUATION POLES

(75) Inventors: Keizo Miyamoto, Daito (JP); Yuji Nakagawa, Daito (JP); Hideaki Fujiura, Toyonaka (JP); Shinichi Kodama, Higashiosaka (JP); Yasuo Nitani, Kobe (JP)

(73) Assignees: Sanyo Electric Co., Ltd., Moriguchi (JP); Sanyo Electronic Components Co., Ltd., Daito (JP)

( * ) Notice: Subject to any disclaimer, the term of this patent is extended or adjusted under 35 U.S.C. 154(b) by 0 days.

(21) Appl. No.: 09/960,964

(22) Filed: Sep. 25, 2001

(65) Prior Publication Data

US 2002/0135438 A1 Sep. 26, 2002

(30) Foreign Application Priority Data

Mar. 23, 2001 (JP) .................... 2001-084431
Jun. 27, 2001 (JP) .................... 2001-193827

(51) Int. Cl.$^7$ .................... H01P 1/213; H03H 9/64
(52) U.S. Cl. .................... 333/133; 333/193
(58) Field of Search .................... 333/133, 193

(56) References Cited

U.S. PATENT DOCUMENTS 5,936,483 A * 8/1999 Ikada .................... 333/133
6,057,744 A * 5/2000 Ikada .................... 333/133

FOREIGN PATENT DOCUMENTS

JP 5-251905 9/1993

* cited by examiner

Primary Examiner—Michael Tokar
Assistant Examiner—Lam T. Mai
(74) Attorney, Agent, or Firm—Armstrong, Westerman & Hattori, LLP (57) ABSTRACT

A filter unit comprising a band-pass filter for passing signals of a specified frequency band, a SAW filter for passing signals of a band around a frequency fp2 positioned between a cutoff frequency fc of the band-pass filter and an attenuation pole frequency fp1 thereof, and an inversion circuit for inverting the phase of the signal passing through the SAW filter and superposing the phase-inverted signal on an output signal from the band-pass filter.

5 Claims, 10 Drawing Sheets

FILTER UNIT HAVING TWO ATTENUATION POLES

BACKGROUND OF THE INVENTION

The present invention relates to filter units for passing signals of a desired frequency band, and to duplexers comprising such filter units.

DESCRIPTION OF THE RELATED ART

Figure 12:
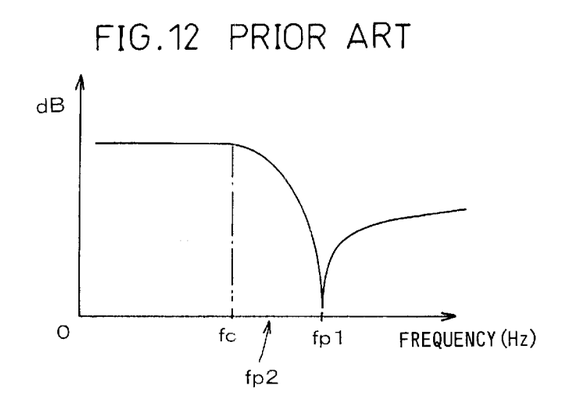
FIG. 12 is a graph showing the common characteristics of a low-pass filter.
Figure 13:
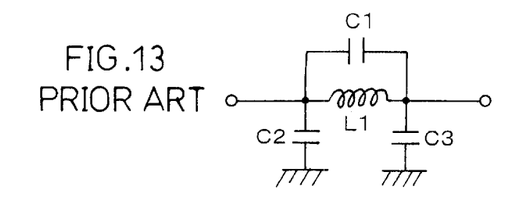
FIG. 13 is a block diagram showing the internal construction of the low-pass filter.

FIG. 12 is a graph showing the common characteristics of a low-pass filter (hereinafter referred to briefly as "LPF") for passing low frequencies. FIG. 13 is a block diagram showing the internal construction of the low-pass filter. The filter comprises an inductance L1, a capacitance C1 connected in parallel thereto, and capacitances C2, C3 connected between the inductance L1 and the ground. With reference to FIG. 12, fc is a cutoff frequency. The frequency characteristics gently attenuate from the cutoff frequency fc toward higher frequencies and have an attenuation pole (point where the level of passage is minimized) at a frequency of fp1. Thus, the pass level is minimum at fp1. As is known well, the cutoff frequency fc is dependent on the inductance L1 and capacitances C2, C3, and the attenuation pole frequency fp1 on the inductance L1 and capacitance C1.

However, conventional filters have the following problem.

LPFs have frequency characteristics which attenuate gently from the cutoff frequency fc toward higher frequencies. Accordingly, if there is a narrow frequency band wherein signals are to be blocked for the prevention of noise between the cutoff frequency fc and the attenuation pole frequency fp1 as indicated at fp2 in FIG. 12, this frequency band can not be fully attenuated.

Figure 14:
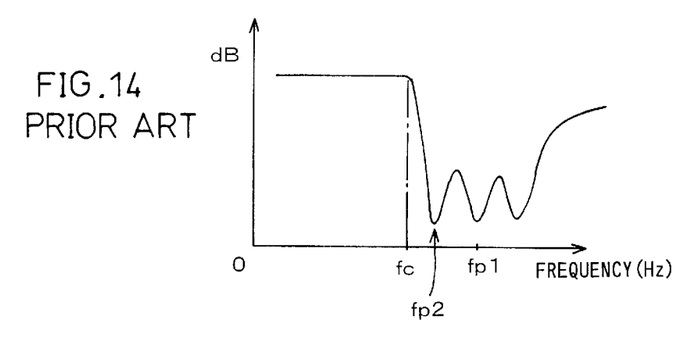
FIG. 14 is a graph showing frequency characteristics involving a plurality of attenuation poles.
Figure 15:
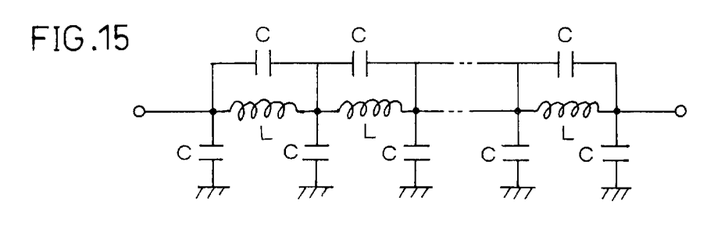
FIG. 15 is a block diagram of a filter comprising many combinations, as connected in series, of capacitance C and inductance L coupled thereto.

To give sharp attenuation characteristics to the LPF to block the passage of signals of the frequency band fp2 in the vicinity of the cutoff frequency fc, it appears feasible to arrange in series many combinations of capacitance C and inductance L connected thereto as shown in FIG. 15 and to provide a plurality of attenuation poles as seen in FIG. 14. Nevertheless, this makes the circuit construction of the LPF complex, rendering the device incorporating the LPF large-sized.

SUMMARY OF THE INVENTION

An object of the present invention is to provide a simple construction for blocking signals of a frequency band positioned between a cutoff frequency and an attenuation pole frequency.

The present invention provides a filter unit comprising a band-pass filter 2 for passing signals of a specified frequency band, a SAW filter 3 or dielectric resonator for passing signals of a band around a frequency fp2 positioned between a cutoff frequency fc of the band-pass filter 2 and an attenuation pole frequency fp1 thereof, and an inversion circuit 4 for inverting the phase of the signal passing through the SAW filter 3 or dielectric resonator and superposing the phase-inverted signal on an output signal from the band-pass filter 2.

Figure 2:
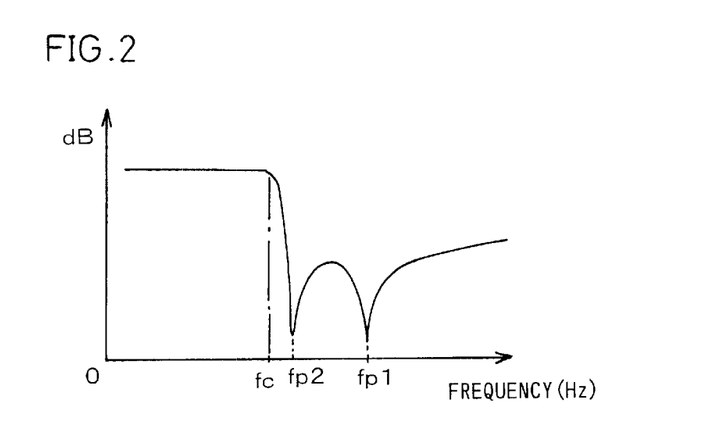
FIG. 2 is a graph showing the frequency characteristics of the filter unit.

The SAW filter 3 passes a signal of a band around a frequency fp2 positioned between the cutoff frequency fc of the band-pass filter 2 and the attenuation pole frequency fp1 thereof. This signal has its phase inverted by the inversion circuit 4. Stated more specifically, the signal of the band around the frequency fp2 to be blocked is attenuated as indicated by a chain line in FIG. 4 and superposed on the output signal form the band-pass filter 2. Consequently, the output signal passing through the filter unit has two attenuation poles fp1, fp2, as shown in FIG. 2, sharpening the attenuation characteristics between the cutoff frequency fc and the frequency fp2 to be blocked. Thus, the signal of a frequency band positioned in the vicinity of the cutoff frequency fc can be blocked by a simple arrangement. This serves to reduce the size of the device into which the filter unit is to be incorporated.

BRIEF DESCRIPTION OF THE DRAWINGS

FIG. 21(*a*) is a Smith chart showing the characteristics of a first filter unit, and FIG. 21(*b*) is a Smith chart showing the characteristics of a second filter unit;

DETAILED DESCRIPTION OF THE PREFERRED EMBODIMENTS

Embodiments of the present invention will be described below in detail with reference to the drawings.

LPF

Figure 1:
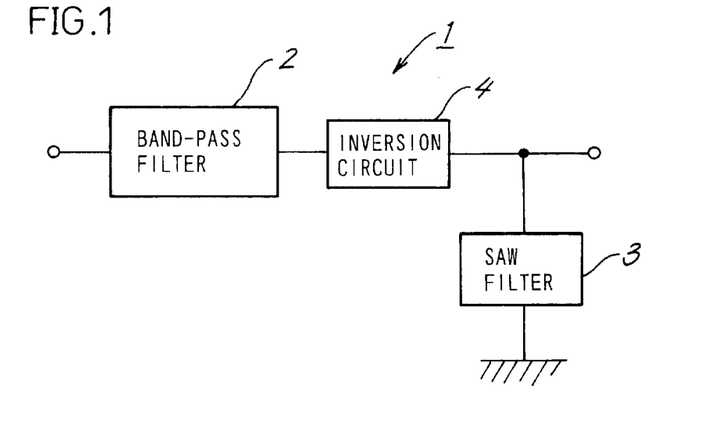
FIG. 1 is a block diagram of a filter unit of the invention.

FIG. 1 is a block diagram of a filter unit 1 of this embodiment. The filter unit comprises a band-pass filter 2 which is an LPF, and a SAW filter 3 and an inversion circuit 4 which are provided between the filter 2 and the ground, the inversion circuit 4 being adapted to invert the phase of the signal passing through the SAW filter 3. The band-pass filter 2 has the same frequency characteristics as in the prior art as shown in FIG. 12.

In the following description, the SAW filter 3 can be replaced by a dielectric resonator.

Figure 3:
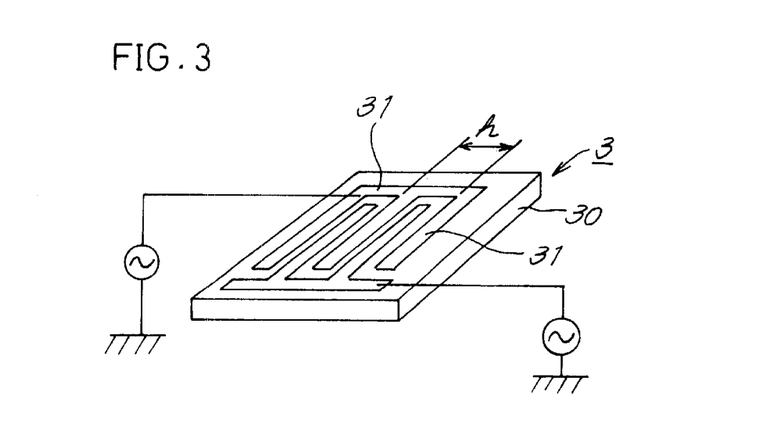
FIG. 3 is a perspective view of a SAW filter.

FIG. 3 is a perspective view of the SAW filter 3, which is termed a surface acoustic wave filter. As is known well, the filter comprises a piezoelectric body 30 in the form of a plate, and electrode digits 31, 31 formed on the body 30 in the shape of combs and providing a conductor pattern. The electrode digits 31, 31 are termed also IDT (Interdigital Transducer) electrodes. The pitch h of electrode digits 31, 31 is approximately equal to the wavelength of the signal to be passed through the filter.

When signals of different frequencies are input to the input stage of the SAW filter 3, only the signal of a particular frequency band having a wavelength approximately equal to the pitch h of the electrode digits 31, 31 is allowed to pass, with signals of the other frequency bands blocked.

Figure 4:
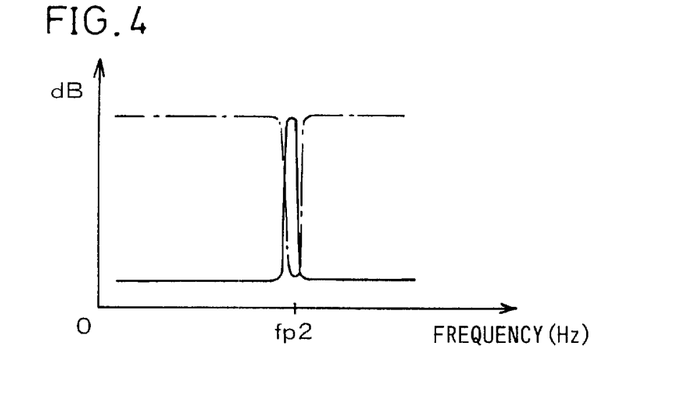
FIG. 4 is a graph showing the frequency characteristics of the SAW filter.

FIG. 4 is a graph showing the frequency characteristics of the SAW filter 3. The SAW filter 3 passes the signal of a band around a frequency of fp2 and blocks signals of other frequency bands. The frequency characteristics are represented by a solid line in FIG. 4. However, the phase of the signal passing through the SAW filter 3 is inverted by the inversion circuit 4, and the frequency characteristics at this time are such that the signal of a band around the frequency fp2 is attenuated as indicated in a chain line in FIG. 4. The inverted signal is superposed on the output signal of the band-pass filter 2. The frequency characteristics of the filter unit have attenuation poles at frequencies of fp1 and fp2 as shown in FIG. 2. Consequently, the attenuation characteristics between the cutoff frequency fc and the frequency fp2 to be blocked become sharp, and the signal of a frequency band positioned in the vicinity of the cutoff frequency fc can be blocked by a simple arrangement. This serves to reduce the size of the device into which the filter unit is to be incorporated.

Thus, the present embodiment is characterized in that the desired frequency is blocked by the combination of the SAW filter 3 and the inversion circuit 4. In other words, the SAW filter 3, which is used generally as a band-pass filter, is used for blocking the desired frequency according to the present embodiment.

The SAW filter 3 passes a signal of specified frequency band by mechanical resonance and is not adapted to pass the signal by electrical resonance. The filter 3 is therefore less likely to exert an influence of noise or the like on the LPF and diminishes the influence of loss on the pass band. High attenuation is also available over a wide frequency band to be blocked.

HPF

Figure 5:
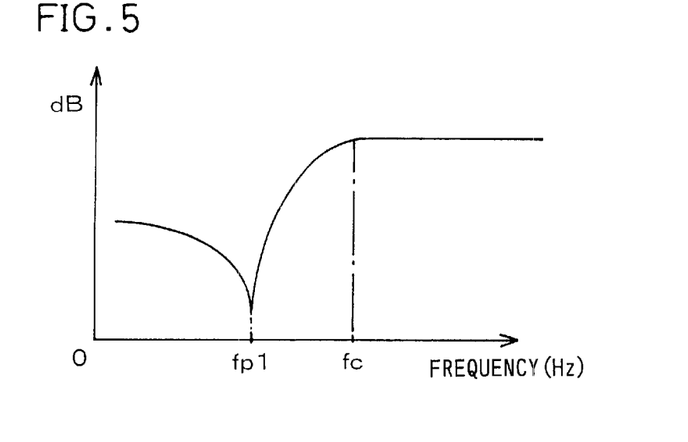
FIG. 5 is a graph showing the common characteristics of a high-pass filter.
Figure 6:
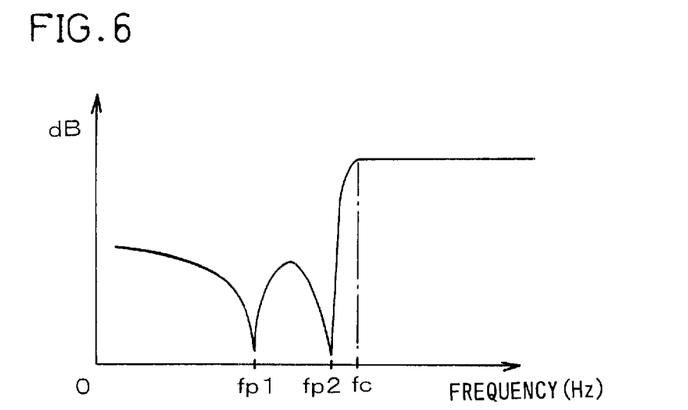
FIG. 6 is a graph showing the frequency characteristics of another filter unit.

Although an LPF serves as the band-pass filter 2, the filter 2 may be a high-pass filter (hereinafter referred to as "HPF") permitting passage of high frequencies. FIG. 5 is a graph showing the common characteristics of the high-pass filter. The characteristics involve gentle attenuation from a cutoff frequency fc toward an attenuation pole frequency fp1 on the lower side. As in FIG. 1, the filter unit 1 comprises a band-pass filter 2, and an inversion circuit 4 and a SAW filter 3 which are connected to the filter 2 and which attenuate signals of a band around a frequency fp2 positioned between the cutoff frequency fc and the attenuation pole frequency fp1 as shown in FIG. 6. As is the case with the foregoing filter unit, sharp attenuation characteristics are available between the cutoff frequency fc and the frequency fp2 to be blocked.

BPF

Figure 7:
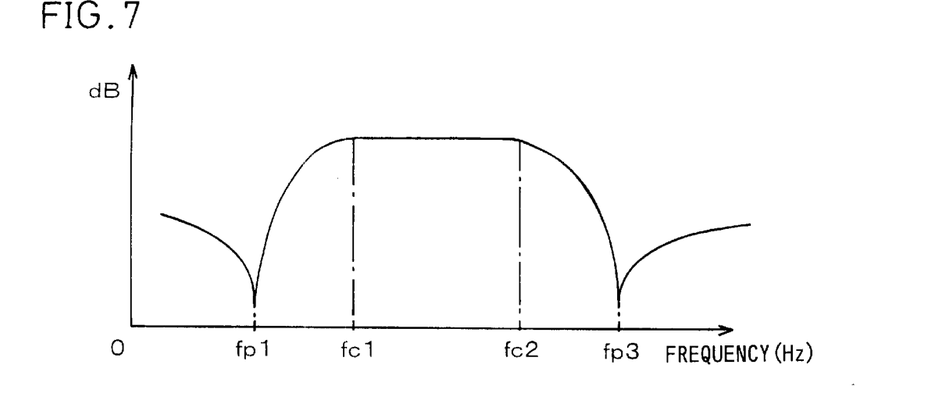
FIG. 7 is a graph showing the common characteristics of a band-pass filter.

The band-pass filter 2 may be a band-pass filter (hereinafter referred to as "BPF") permitting passage of frequencies in an intermediate band. FIG. 7 shows the common characteristics of the band-pass filter which have two cutoff frequencies fc1, fc2. The frequency fc2 is higher than the frequency fc1, and the attenuation pole frequencies are fp1 and fp3 which is higher than fp1.

Figure 8:
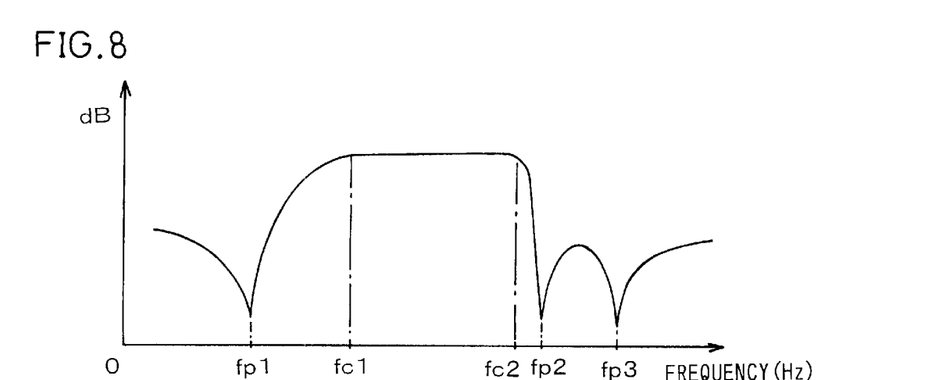
FIG. 8 is a graph showing frequency characteristics in the case where the frequency fp2 to be blocked is positioned between a cutoff frequency fc2 and an attenuation pole frequency fp3.

FIG. 8 is a graph showing the frequency characteristics afforded by the inversion circuit 4 and SAW filter 3 in the case where the frequency fp2 to be blocked is positioned between the cutoff frequency fc2 and the attenuation pole frequency fp3. As in the previous case, the attenuation characteristics are sharpened between the cutoff frequency fc2 and the frequency fp2 to be blocked.

Figure 9:
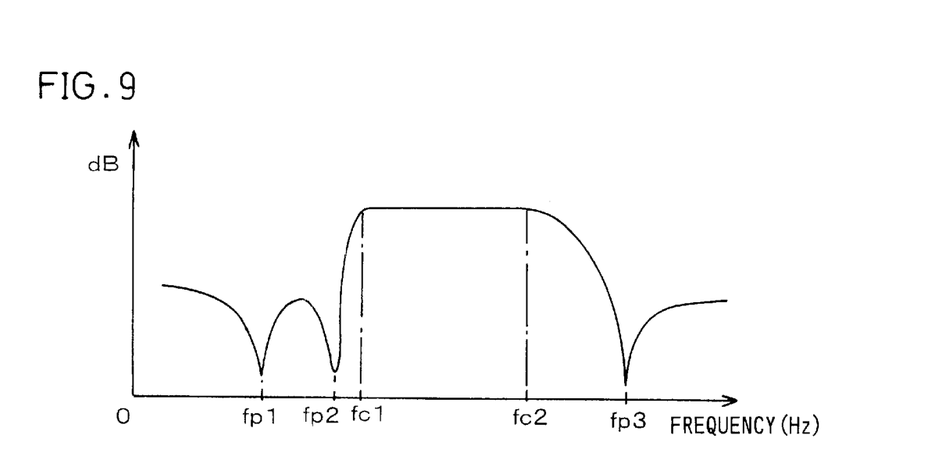
FIG. 9 is a graph showing frequency characteristics in the case where the frequency fp2 to be blocked is positioned between a cutoff frequency fc1 and an attenuation pole frequency fp1.

FIG. 9 is a graph showing the frequency characteristics afforded by the inversion circuit 4 and SAW filter 3 in the case where the frequency fp2 to be blocked is positioned between the cutoff frequency fc1 and the attenuation pole frequency fp1. Sharpened attenuation characteristics are available also in this case between the cutoff frequency fc1 and the frequency fp2 to be blocked. Thus, signals of a frequency band positioned in the vicinity of the cutoff frequency fc2 can be blocked by a simple arrangement.

The present applicant assumes the signal band for use in mobile phone communication as the band around the frequency fp2 to be blocked. Stated more specifically, assumed as the band around the frequency fp2 is the frequency band between 1.5 GHz for use in GPS and 2.4 GHz to be used for Bluetooth (trademark). GPS (global positioning system) is a system for indicating positions on the earth by the information from artificial satellites. Bluetooth is one of short distance radio standards which was proposed in 1998.

Figure 10:
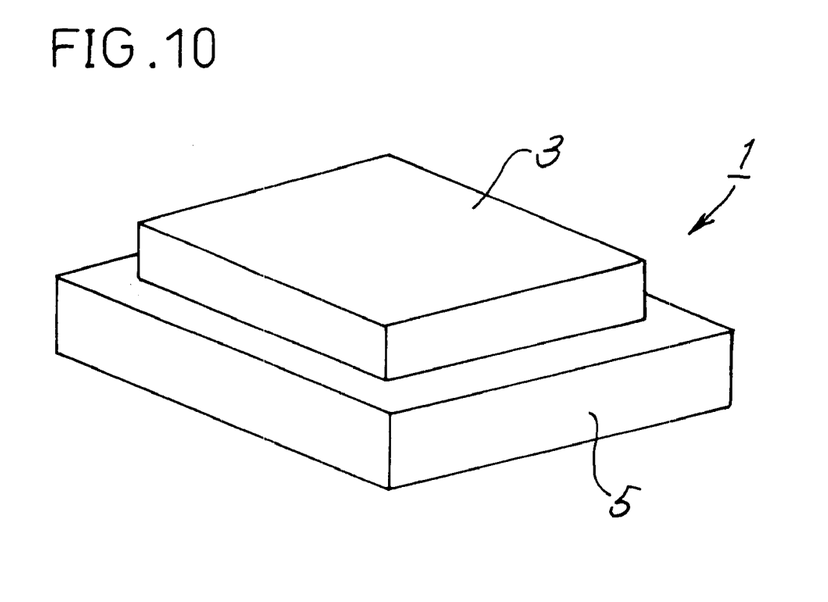
FIG. 10 is a perspective view of a filter unit comprising a ceramic laminate substrate and a SAW filter mounted thereon.
Figure 11:
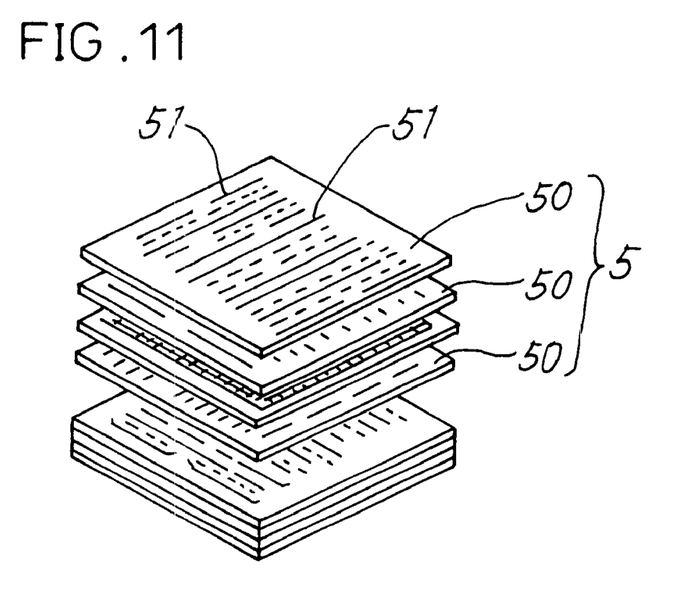
FIG. 11 is an exploded perspective view of the ceramic laminate substrate.

FIG. 10 is a perspective view of a filter unit 1 comprising a ceramic laminate substrate 5 having incorporated therein a band-pass filter 2 and an inversion circuit 4, and a SAW filter 3 mounted on the substrate 5. The laminate substrate 5 comprises many green sheet substrates 50 having a conductive pattern 51 formed on the upper surface thereof and arranged in superposed layers as shown in FIG. 11 and as already known. The conductive pattern 51 provides an inductance L and capacitance C.

Figure 16:
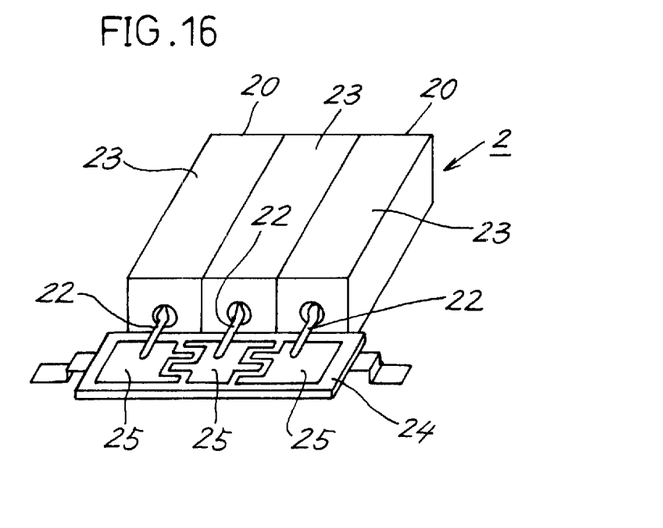
FIG. 16 is a perspective view of a band-pass filter comprising a plurality of coaxial resonators.

Various band-pass filters 2 are available which include, for example, the filter shown in FIG. 16 (see JP-A No. 5-251905).

The illustrated filter comprises coaxial resonators, i.e. resonators 20 each comprising a rectangular parallelepipedal dielectric block 21 provided with an internal conductor 22 and an external conductor 23. The resonators 20 are capacitance-coupled to one another to obtain desired frequency characteristics. More specifically, a dielectric substrate 24 is disposed in front of the resonators 20, with a plurality of coupling electrodes 25 provided on the substrate 24 in corresponding relation with the respective resonators 20. The internal conductors 22 are soldered to the respective coupling electrodes 25. The capacitance between the electrodes 25 provides capacitance between the resonators 20.

However, the filter shown in FIG. 16 has the problem of being great in overall size. Accordingly, the present applicant has proposed a band-pass filter 2 of triplate structure shown in FIGS. 17 and 18. The filter has a plurality of ¼ wavelength resonance electrodes 72, 72 provided on a first dielectric substrate 7 and each connected to a grounding electrode 71. Input-output electrodes 73, 73 extend outward respectively from two of the resonance electrodes 72, 72. Placed on the first dielectric substrate 7 is a second dielectric substrate 70 provided with a grounding face 74. The resonance electrodes 72, 72 are so arranged that an open end thereof not connected to the grounding electrode 71 alternates with a short-circuited end, i.e., an end connected to the grounding electrode 71, longitudinally of the first dielectric substrate 7. The resonance electrodes are coupled by virtue of an electromagnetic phenomenon due to this arrangement. The resonance electrodes 72, 72 may be in a comline arrangement or interdigital arrangement, and are not limited to those shown in FIG. 17 in shape.

Figure 17:
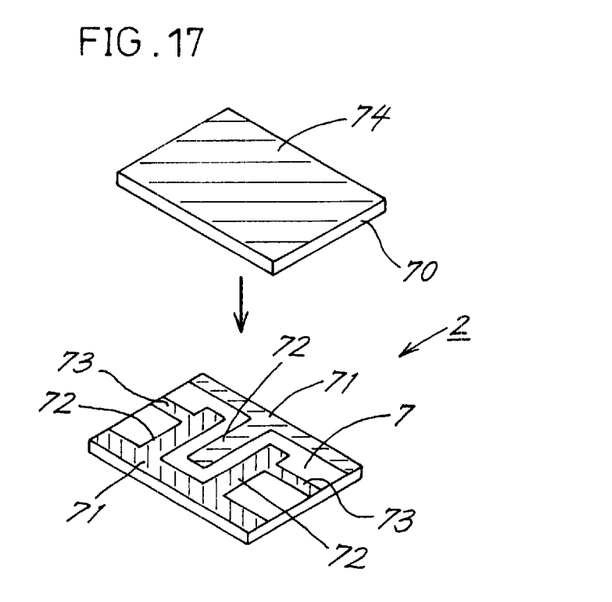
FIG. 17 is an exploded perspective view of a band-pass filter of triplate structure.
Figure 18:
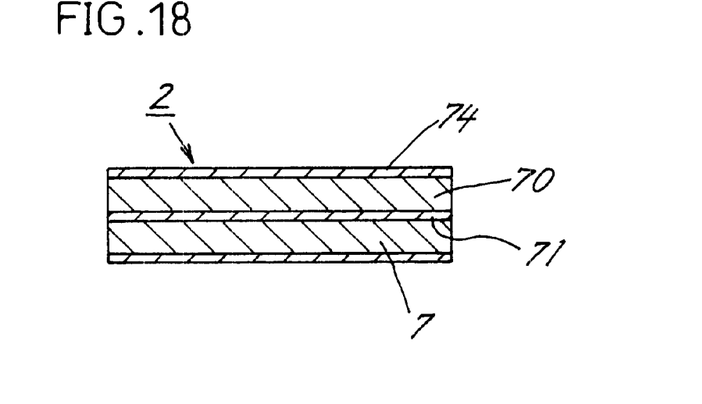
FIG. 18 is a side elevation in section of the band-pass filter of triplate structure.

In the case of the triplate structure, the dielectric substrates 7, 70 are provided in superposed layers, so that the entire assembly can be reduced in thickness. This serves to compact the band-pass filter 2, consequently making the filter unit 1 smaller in overall size.

[Duplexer]

Figure 19:
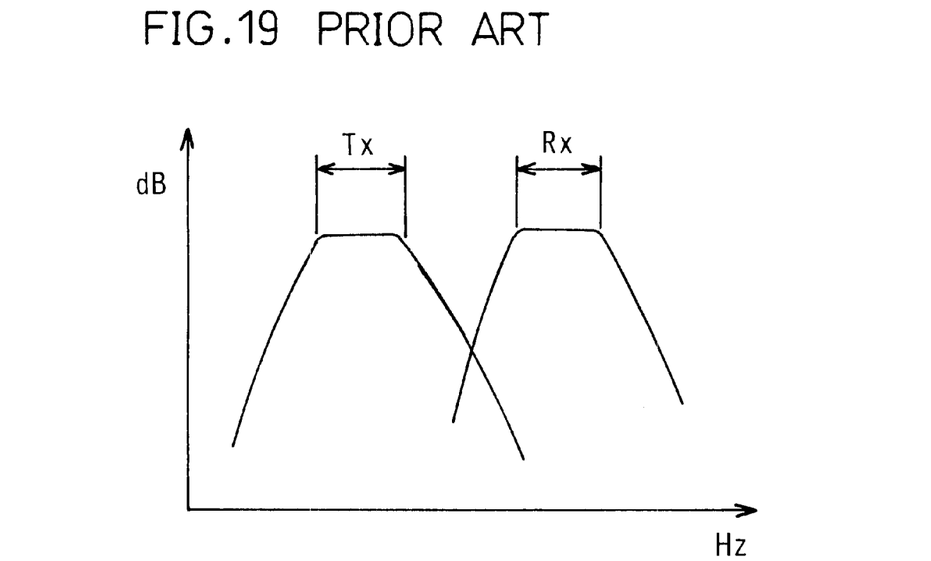
FIG. 19 is a graph showing the attenuation characteristics of a common duplexer.

The present applicant has conceived the idea of providing a duplexer 6 using the filter unit 1 described. The duplexer 6 is a known device disposed at the inlet-outlet of antenna of a communications device and having the function of separating transmitted waves from received waves. FIG. 19 shows the attenuation characteristics of a common duplexer. The transmission signal is indicated at Tx, and the reception signal at Rx. Both signals are about 60 MHz in pass band. The applicant assumes the duplexer 6 to be useful for communications devices, for example, in conformity with W-CDMA (wideband CDMA) standards.

Figure 20:
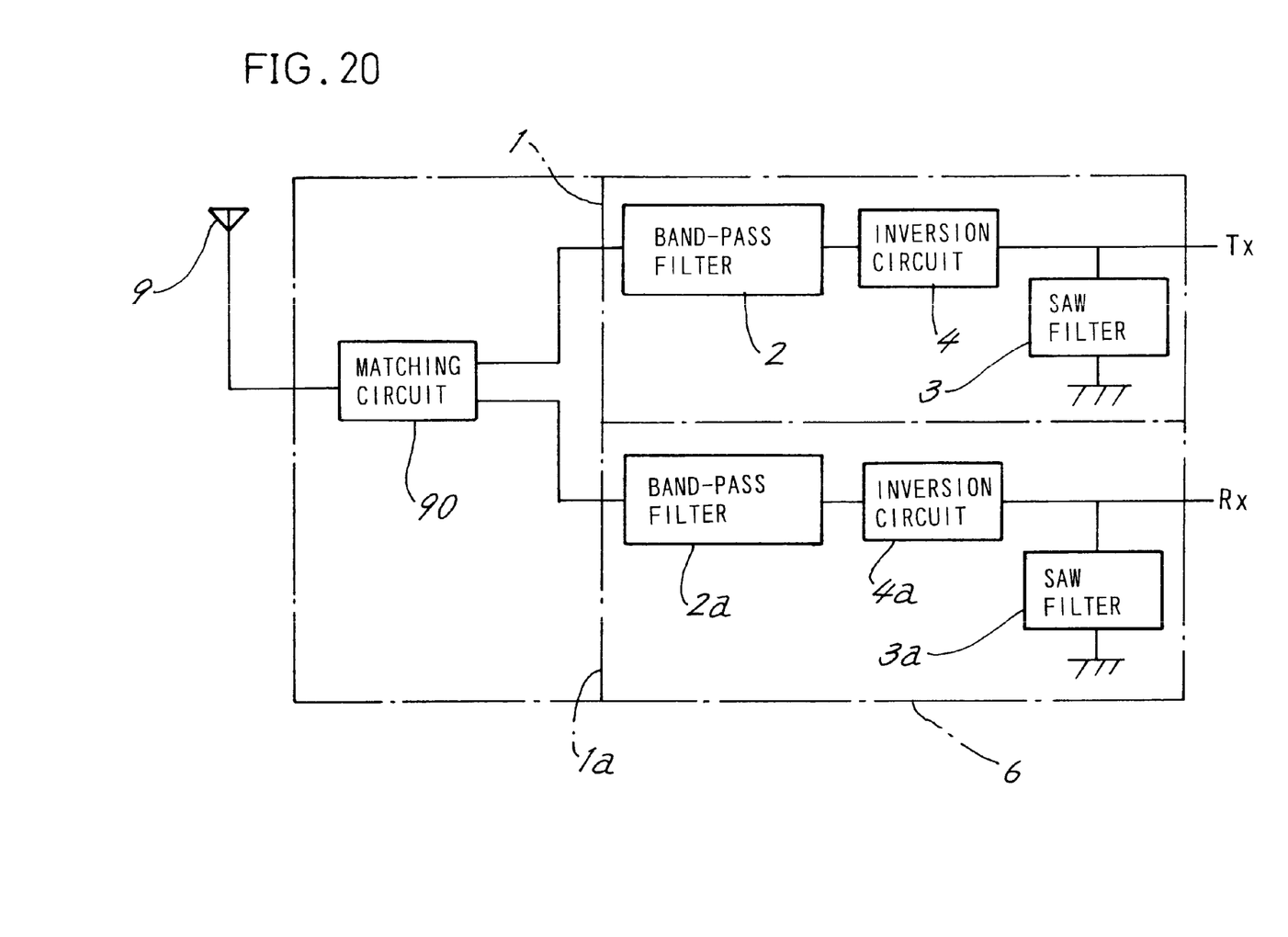
FIG. 20 is an internal block diagram of the duplexer.

FIG. 20 is an internal block diagram of the duplexer 6. The duplexer 6 comprises first and second filter units 1, 1a connected in parallel. The transmission signal Tx passes through the first filter unit 1, and the reception signal Rx through the second filter unit 1a.

Because an antenna 9 is about 50Ω in impedance, the output stage of the first filter unit 1 or the input stage of the second filter unit 1a needs to be set at an impedance of about 50Ω; otherwise, the transmission of signals would involve an increased loss. Accordingly, a matching circuit 90 is provided between the antenna 9 and the two filter units 1, 1a for the matching of impedance.

Figure 21:
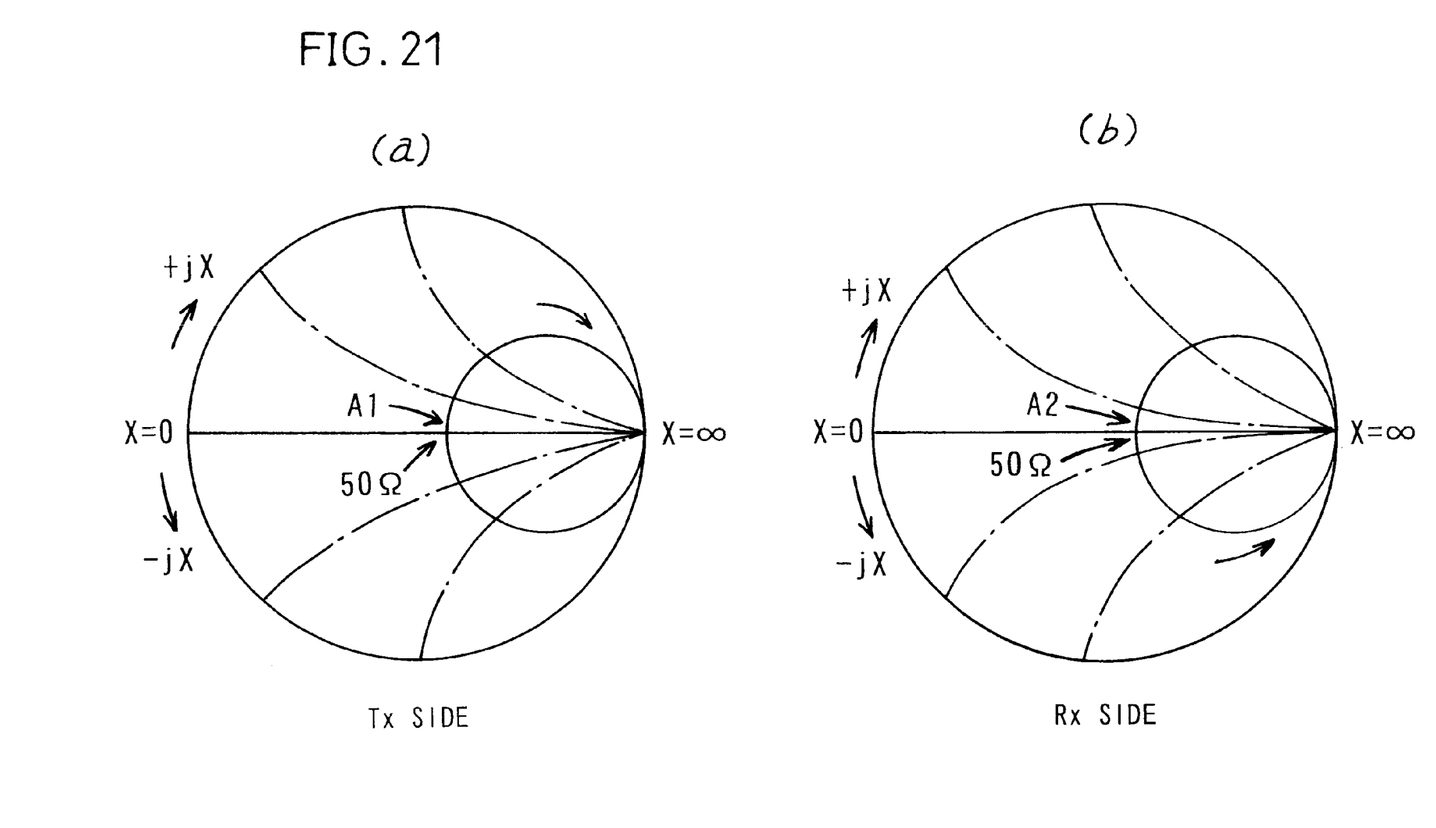

FIG. 21(a) is a Smith chart showing the characteristics of the first filter unit 1, and FIG. 21(b) is a Smith chart showing the characteristics of the second filter unit 1a. The constant-resistance line is in the form of a solid-line circle, and the constant-reactance line is indicated by a chain line. The matching circuit 90 makes the impedance of the first filter unit 1 to the transmission signal equal to 50Ω as indicated at A1 in FIG. 21(a). The impedance to the reception signal at this time becomes approximate to the value of infinity to diminish the adverse effect by the reception signal, with the constant-resistance line shifted clockwise.

Similarly, the matching circuit 90 makes the impedance of the second filter unit 1a to the reception signal equal to 50Ω as indicated at A2 in FIG. 21(b). The impedance to the transmission signal at this time becomes approximate to the value of infinity to diminish the adverse effect by the transmission signal, with the constant-resistance line shifted counterclockwise.

Since the two filter units 1, 1a are capable of blocking signals of frequency band positioned in the vicinity of the cutoff frequency fc by a simple construction, unnecessary signals of frequency band in the vicinity of the transmission band Tx or reception band Rx can be attenuated effectively. The duplexer 6 comprising the two filter units 1, 1a is also simple in construction.

As previously stated, the band-pass filter 2 of triplate structure can be used as the band-pass filter of each of the filter units 1, 1a. The band-pass filter of triplate structure used as the band-pass filter 2a of the second filter unit 1a serves to reduce the overall size of the filter unit 1a. The band-pass filter 2 of triplate structure may of course be used as the band-pass filter 2 of the first filter unit 1.

Figure 22:
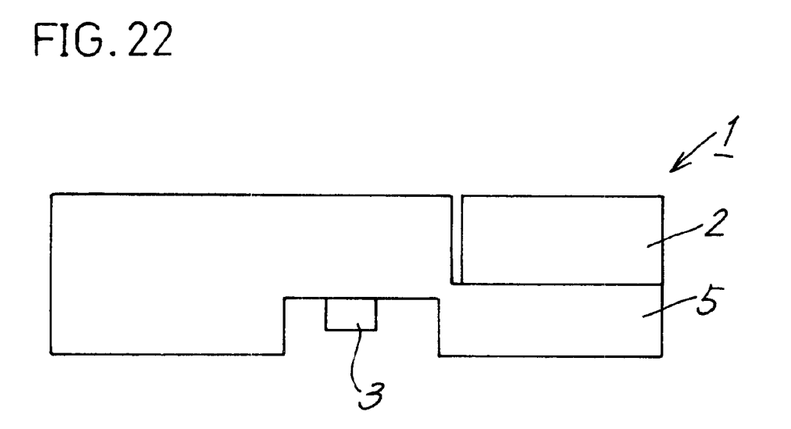
FIG. 22 is a front view of a filter unit comprising a SAW filter and a band-pass filter which are mounted on a laminate substrate.

FIG. 22 is a front view of a filter unit 1 comprising a SAW filter 3 and a band-pass filter 2 which are mounted on a ceramic laminate substrate 5 having an inversion circuit 4 incorporated therein. In view of the convenience of transport and convenience of mounting the unit on a circuit board (not shown), the applicant provides the band-pass filter 2 of triplate structure and the SAW filter 3 which are in the form of a unit.

Figure 23:
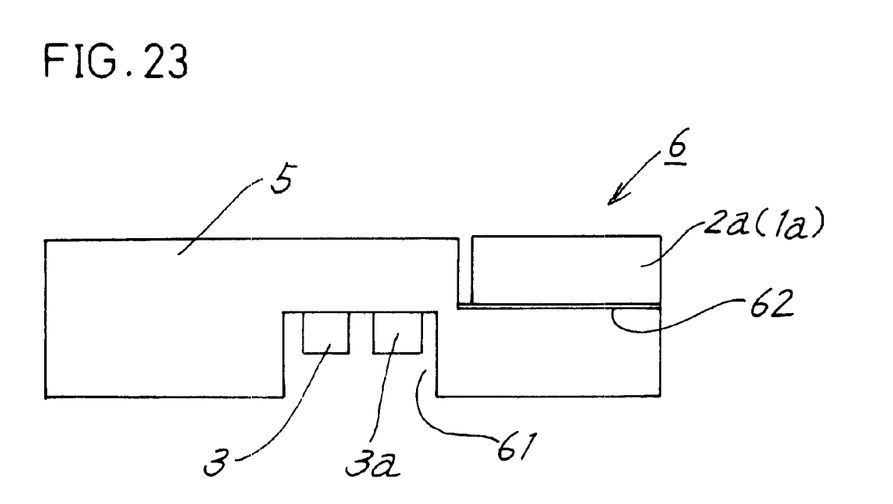
FIG. 23 is a front view of a duplexer in the form of a single chip.

The applicant has further conceived the idea of making the duplexer 6 of FIG. 20 into a single chip shown in FIG. 23 with use of a laminated substrate 5.

The band-pass filter 2a of the second filter unit 1a has a triplate structure comprising superposed substrates of high dielectric constant. The laminate substrate 5 comprises, for example, a plurality of superposed substrates of LTCC (Low-Temperature Cofired Ceramic). The laminate substrate 5 has incorporated therein a matching circuit 90, inversion circuits 4, 4a and band-pass filter 2 of the first filter unit 1. The component substrates are electrically interconnected, for example, by way of through holes. A conductive layer 62 is provided between the laminate substrate 5 and the band-pass filter 2a of the second filter unit 1a. Provided in a cavity 61 in the bottom of the laminate substrate 5 and connected to the substrate 5 are SAW filters 3, 3a or dielectric resonators of the two filter units 1, 1a. The inversion circuits 4, 4a are provided within the laminate substrate 5. The band-pass filter 2 of the first filter unit 1 may be of triplate structure.

The duplexer 6 can be compacted when thus fabricated in the form of a chip.

The inversion circuit 4, although disposed separately from the band-pass filter 2 as described above, can be made into a unit along with the filter.

What is claimed is:

1. A filter unit, comprising:
   a band-pass filter for passing signals of a specified frequency band;
   a SAW filter or dielectric resonator for passing signals of a band around a frequency fp2 positioned between a cutoff frequency fc of the band-pass filter and an attenuation pole frequency fp1 thereof; and
   an inversion circuit for inverting the phase of the signal passing through the SAW filter or dielectric resonator and superposing the phase-inverted signal on an output signal from the band-pass filter,
   wherein the band-pass filter has a triplate structure.

2. A filter unit according to claim 1, wherein the band-pass filter passes low frequencies, intermediate frequencies or high frequencies and comprises the combination of an inductance L and capacitance C.

3. A filter unit according to claim 1, wherein the band-pass filter, and the SAW filter or dielectric resonator are mounted on a laminate substrate as a unit.

4. A duplexer comprising two filter units connected in parallel, each of the filter units comprising:

a band-pass filter for passing signals of a specified frequency band;

a SAW filter or dielectric resonator for passing signals of a band around a frequency fp2 positioned between a cutoff frequency fc of the band-pass filter and an attenuation pole frequency fp1 thereof; and an inversion circuit for inverting the phase of the signal passing through the SAW filter or dielectric resonator and superposing the phase-inverted signal on an output signal from the band-pass filter, one of the filter units having a transmission frequency in the pass band thereof, the other filter unit having a reception frequency in the pass band thereof, wherein the band-pass filter of at least one of the filter units has a triplate structure.

5. A duplexer according to claim 4, wherein the band-pass filter, and the SAW filter or dielectric resonator are mounted on a laminate substrate as a unit.

* * * * *